United States Patent [19]
Bloker

[11] Patent Number: 4,935,649
[45] Date of Patent: Jun. 19, 1990

[54] CLAMPED SENSE AMPLIFIER

[75] Inventor: Raymond E. Bloker, San Jose, Calif.

[73] Assignee: Cypress Semiconductor Corporation, San Jose, Calif.

[21] Appl. No.: 217,682

[22] Filed: Jul. 11, 1988

[51] Int. Cl.[5] .................... H03F 3/45; H03K 17/60
[52] U.S. Cl. ................................ 307/530; 307/451; 307/272.2
[58] Field of Search ............... 307/443, 448, 451, 530, 307/272.2

[56] References Cited

U.S. PATENT DOCUMENTS

| 4,694,201 | 9/1987 | Jason | 307/451 |
| 4,742,247 | 5/1988 | Venkatesh | 307/451 |
| 4,785,205 | 11/1988 | Sanwo et al. | 307/451 |

FOREIGN PATENT DOCUMENTS 2340770  9/1985  Fed. Rep. of Germany ...... 307/578

Primary Examiner—Stanley D. Miller
Assistant Examiner—Margaret Rose Wambach
Attorney, Agent, or Firm—Blakely, Sokoloff, Taylor & Zafman

[57] ABSTRACT

The invention relates to an improved CMOS clamped sense amplifier having an input terminal adapted to receive the signal to be sensed. The signal passes through a CMOS input clamp circuit which includes a pair of complementary MOS transistors having their drains coupled together and to the input terminal, and their sources adapted to be coupled respectively to opposite power supply terminals. The input signal also passes to a voltage gain stage coupled to the input terminal and having an output terminal for providing the amplified output signal from the sense amplifier. To achieve the enhanced signal throughput speed, a resistance means is employed, coupled between the gates of the transistors of the CMOS input clamp circuit and the input terminal. Although this resistance reduces the clamping effectiveness of the clamping circuit, it still decreases the overall throughput time through the sense amplifier, thus increasing switching speed.

7 Claims, 1 Drawing Sheet

CLAMPED SENSE AMPLIFIER

BACKGROUND OF THE INVENTION

1. Field of the Invention

The present invention relates to a CMOS clamped sense amplifier. Sense amplifiers are used to amplify output signals from semiconductor storage arrays such as static random access memories, programmable read-only memories and programmable logic devices. Each of these storage arrays needs to be "sensed" to read the data stored in the devices. This data is stored within semiconductor structures in the array which are generally capable of producing only very low level output signals which indicate the data. These output signals are binary, ones or zeros, and the difference between the two binary levels is very small. Accordingly, a sense amplifier is required to amplify the level of these signals in order to further utilize them.

2. The Prior Art

Most prior art sense amplifiers used in complementary MOS ("CMOS") technologies employ a CMOS clamp at the input to reduce the input signal swings and thus the propagation delay of data through the sense amplifier. Reducing the delay through the sense amplifier is important in order to minimize delays in accessing data stored in the device.

The purpose of the input clamp circuit on prior art devices is to limit the swing of the input voltage to a magnitude just large enough to provide a full CMOS voltage level voltage swing (for example, from ground or $V_{ss}+0.2$ volts to $V_{cc}-0.2$ volts) at the output of the amplifier voltage gain stage. Unclamped circuits providing unlimited input voltage swings tend to be slower because of the additional time it takes to slew the excessive voltage swings beyond that required to properly operate the voltage gain stage. Moreover, the clamp circuit in prior art devices is designed to track with the voltage gain stage so that variations in processing, supply voltage and temperature are tolerated and still insure that the center point of the input voltage swing remains equal to the trip point of the transistors in the voltage gain stage. It has been found that limiting the magnitude of the input swing voltage using an input clamp circuit, followed by adjusting the mid-level output voltage from the clamp circuit to match the trip point of the voltage gain stage, improves the overall speed of the sense amplifier circuit.

Clamped sense amplifiers of the prior art have one disadvantage. When the input signal to the sense amplifier is rising, one of the CMOS transistors of the clamping circuit is turned on, pulling the input signal towards ground. Since the input signal is rising while at the same time is being pulled towards ground by the clamping circuit, the time required for the input signal to rise to its maximum level is increased. The reverse situation takes place when the input signal is falling, since the other MOS transistor in the input clamp is turned on and thus tends to pull the input voltage level towards the positive power supply voltage. This also fights the fall of the input signal, again causing delay.

Accordingly, although CMOS input clamp circuits limit voltage swings and generally speed up the operation of the sense amplifier, the improvement obtained from these clamping circuits is diminished to some considerable extent by this counteraction by the input clamping circuit of the rise and fall of the input signal voltage.

For example, if the input signal to a clamped sense amplifier of the prior art starts out a low voltage, for example, 0.5 volts, and begins to rise to its high voltage of approximately 2 volts, the N-channel CMOS transistor of the CMOS clamp is turned on when the input voltage reaches approximately 0.8 volts and its gate voltage increases as the input signal continues to rise. This has the effect of turning on the N-channel MOS transistor harder as the input rises, which actually opposes the input signal rising transition. Similarly, when the input signal falls from its high level to a low level, the other P-channel transistor of the input CMOS clamping transistor pair has the same effect of slowing down the input signal fall. The amount by which the input signal transitions are slowed (as a result of increased rise and fall times) is directly proportional to the amount of the reduction of the input swing magnitude obtained by the CMOS clamp. In other words, the better the clamping, the more the undesirable input signal transition delay which results. It would, therefore, be desirable to have an input clamping circuit which is capable of reducing the input voltage swing magnitude without causing a concomitant undesirable increase in input signal voltage transition time.

BRIEF DESCRIPTION OF THE INVENTION

Unexpectedly, it has been discovered that it is possible to obtain adequate reduction in input voltage swing magnitude using the improved clamping circuit of this invention, yet substantially reduce the undesirable side effect of increased input signal transition time. By the addition of a resistance means properly coupled between the input of the sense amplifier and the CMOS clamping circuit, it was unexpectedly found that the transient response of the clamp circuit is reduced so that it is no longer able to operate as fast as the input signal transitions from high to low, and vice versa. This has the effect of reducing the clamping action of the input clamp circuit while decreasing the input rise and fall time when the input signal is in transition, but not when the input signal is stable prior to the next transition. Whereas one would expect that the addition of resistance at the input would increase the overall delay of the sense amplifier, it was found that the clamping action was only reduced during periods when the input is in transition, thereby speeding up the input transition. This reduced clamping action results in overshoot and undershoot of the input signal beyond what is encountered by a clamping circuit without the additional resistance means of this invention. However, the overall effect was unexpectedly found to improve signal throughput time because, prior to the next input transition, the clamping circuit returns the voltage level back to where it would have been without the resistance means, compensating for the overshoot and undershoot.

Briefly stated, the improved clamped sense amplifier of the invention includes an input terminal adapted to receive the signal to be sensed, and a voltage gain stage coupled to the input terminal and having an output terminal for providing the amplified output signal from the sense amplifier. A CMOS input clamp circuit is used which is adapted to receive the signal to be sensed and includes a pair of complementary MOS transistors having their drains coupled together and to the input terminal of the amplifier, and having their sources adapted to be coupled respectively to opposite power supply terminals. A resistance means is coupled between the coupled gates and the input terminal of the amplifier whereby the overall signal throughput speed of the sense amplifier is enhanced.

DETAILED DESCRIPTION OF A PREFERRED EMBODIMENT

Figure 1:
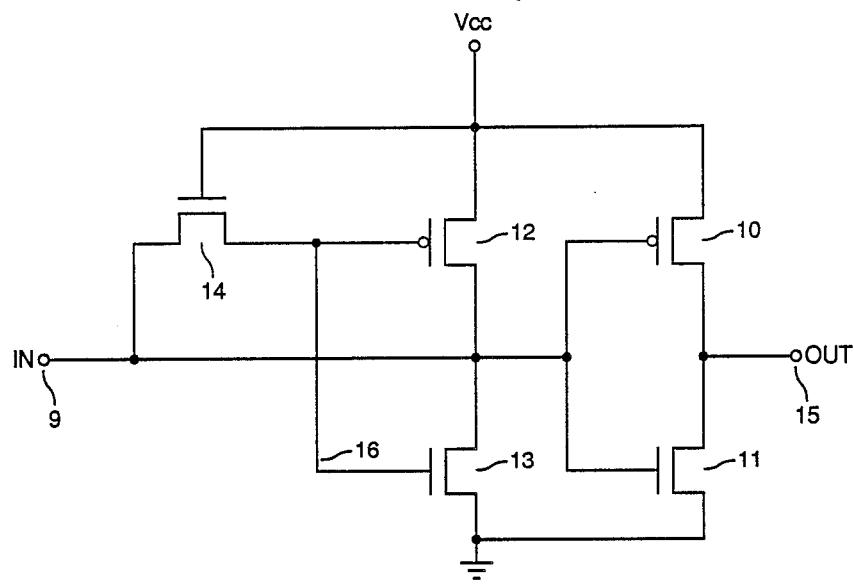
FIG. 1 is a circuit schematic of the clamped sense amplifier of one embodiment of the invention.

In the sense amplifier circuit of the invention shown in FIG. 1, the input signal appears at terminal 9. The input signal can, for example, be the signal sensed from the bit line of a Programmable Logic Device (PLD) or static ram. Generally it is a low voltage signal, between about 1 and 2 volts, for PLDs and between about 4 and 5 volts for static rams. For a PLD, such a signal may start at a level of about 1 volt and rise during its transition to about 2 volts; for a static ram, the signal starts at about 4 volts and rises to about 5 volts.

The main voltage gain stage of the circuit of the invention employs complementary MOS transistors 10 and 11. As is conventional, the small circle on transistor 10 indicates that it is an P-channel transistor. Transistor 11 (without the small circle) is thus an N-channel transistor, making up a complementary transistor pair. The gates of transistors 10 and 11 are connected together and also connected to input terminal 9, as shown. The drains are connected together and also connected to output terminal 15. The sources of transistors 10 and 11 are connected, respectively, to $V_{cc}$ and ground.

The CMOS input clamp circuit comprises MOS transistors 12 and 13, transistor 12 being a P-channel transistor and transistor 13 being an N-channel transistor. Again, the drains of transistors 12 and 13 are connected together and their sources are connected, respectively, to $V_{cc}$ and ground. The connected drains of transistors 12 and 13 are also connected to input terminal 9 and to the gates of transistors 10 and 11.

The purpose of the CMOS input clamp circuit comprising transistors 12 and 13 is to limit the swings of the input voltage to a magnitude just sufficient to provide a full CMOS level swing (from $V_{ss}+0.2$ volts to $V_{cc}-0.2$ volts) at the output 15 of the voltage gain stage comprising transistors 10 and 11. Additionally, the CMOS input clamp circuit is designed using MOS transistors which are compatible with the voltage gain stage so that the two stages track over variations in manufacturing process, supply voltage and temperature, maintaining the center point of the input voltage swing at a level approximately equal to the trip point of the voltage gain stage comprising transistors 10 and 11. By the action of the input clamp circuit, which limits the magnitude of the input voltage swing and adjusts its mid-level voltage to match the trip point of the voltage gain stage, the speed of the sense amplifier circuit is improved.

The clamp circuit, however, does have a disadvantage in that it slows down the transition of the input signal. Typically the signal at input 9 starts at a low voltage, for example, 0.5 volts, and begins to rise to its top voltage of, for example, 2 volts, N-channel transistor 13 is turned on at a given input voltage, generally in the range of about 0.8 volts, and the gate voltage on transistor 13 increases as the input signal continues to rise. This has the effect of turning on transistor 13 more strongly as the input signal level continues to rise, which actually slows the input signal transition. This conflict between the two signals causes a delay in the amplifier throughput. Similarly, when the signal at input terminal 9 falls from its high level to its low level, for example, from 2 to 0.5 volts, P-channel transistor 12 turns on and has the same deleterious effect of slowing down the input signal transition. The degree to which the input signal transition is slowed as a result of these increased rise and fall times is directly proportional to the amount of the reduction in the input voltage swing magnitude. In other words, the better the input clamping circuit, comprising transistors 12 and 13, operates as it should to limit input voltage swings, the larger the resulting deleterious increase in input transition time.

In the circuit of this invention, the resistance means 14 is preferably an MOS transistor acting as a resistor. Resistance means 14 is used to minimize this otherwise unavoidable increase in input signal transition time. Resistance means 14 reduces the transient response time of the input clamp circuit so that it cannot respond as fast to input signal transitions.

The voltage drop across resistance means 14 reduces the additional amount by which transistor 13 is turned on during a input voltage swing from a low voltage to a high one. Since transistor 13 therefore will be less conducting, the input terminal 9 will be pulled less toward ground and therefore the input signal transition from low to high will be less impacted and delayed. In the same manner, because of the voltage drop across resistor 14 during an input high-to-low voltage transition, P-channel transistor 12 will be turned on less hard, and thus will cause less of a delay in the high-to-low transition as well. Therefore, quite unexpectedly, a reduction in clamping effectiveness, when clamping is being used expressly for decreasing the magnitude of voltage swings and thereby increasing switching speed, actually results in an overall increase in switching speed.

The design of resistance means 14 is very important to the invention. Between transitions, it is necessary that the voltage level at the input return to the level it would have been without the resistance means in place. As the r-c delay inserted into the circuit by the addition of resistance means 14 and its associated capacitance increases, the settling time —the time it takes for the overshoot and undershoot additional voltage values to return to their normal values—proportionately increases. In a typical application, the overshoot and undershoot voltage differentials should return to within 50 mv. of their steady-state values before the next input transition, and the resistance value of resistance means 14 should be selected to insure that result.

In other applications, however, the resistance can be larger or smaller, depending on the time between voltage transitions at the input terminal 9. The resistance can be selected to be as large as possible as long as the overshoot and undershoot voltages caused by the resulting r-c delay are not so large that there is insufficient time between transitions for the input voltage to return to its steady-state level (without overshoot or undershoot). In one actual case, it was desirable that the recovery take place in 8 nanoseconds since that was the time between transitions. The higher the resistance selected, the faster the throughput time improvement which will be obtained during input voltage transitions. The selection of this resistance will also be affected by the sizes selected for clamping transistors 12 and 13 as well as the capacitances of the circuit which impact r-c delay time constants.

In practice, resistance means 14 can be any known form of resistor compatible with CMOS technology. For example, a diffused resistor, a deposited nicrome or other resistive metal resistor, or, as was used in the preferred embodiment of the invention, an MOS transistor with its gate connected to a source of fixed potential. In the case of a P-channel MOS transistor, the gate is connected to ground; in the case of an N-channel transistor 14 shown in FIG. 1, the gate is connected to $V_{cc}$. The value of resistance means 14 must be substantially higher than parasitic resistance values found in CMOS circuits which tend to be less than about 100–500 ohms. The value selected for resistance means 14 should be over 1,000 ohms, preferably over 10,000 ohms or more, as necessary to obtain the benefits of the invention as described above. Preferred N-channel transistors used in the invention as resistance mean 14 will have a width-/length ratio (in microns) of approximately 2/4 and preferred P-channel transistors will have a width-/length ratio (in microns) of approximately 2/2. Another satisfactory embodiment employed an N-channel transistor having a width/length ratio (in microns) of 1.8/2.6 in parallel with a P-channel transistor having a width/length ratio of 3/2, the P-channel transistor having its gate connected to ground and the N-channel transistor having its gate connected to $V_{cc}$. These ratios were appropriate in an 0.8 micron minimum channel length CMOS technology. One skilled in the art will readily be able to choose comparable values in other CMOS technologies.

In some applications, it is necessary to temporarily eliminate the clamp from the circuit, for example during certain test conditions. In that case, instead of the coupling of the gates of MOS transistors 12 and 13 being a direct connection 16, as shown in FIG. 1, an MOS coupling transistor (not shown) is used having its source drain circuit coupling the gates of transistors 12 and 13 together. In the embodiment of FIG. 1, an N-channel transistor may be used. When the source drain circuit of that coupling transistor is open, breaking the connection between the gates of transistors 12 and 13, it is possible to pull the gate of transistor 13 all the way to ground and the gate of transistor 12 all the way to $V_{cc}$. However, during normal operation, this MOS coupling transistor is closed and serve to directly couple the gates of MOS transistors 12 and 13 in the same manner, with some small resistance, as connection 16.

Figure 2:
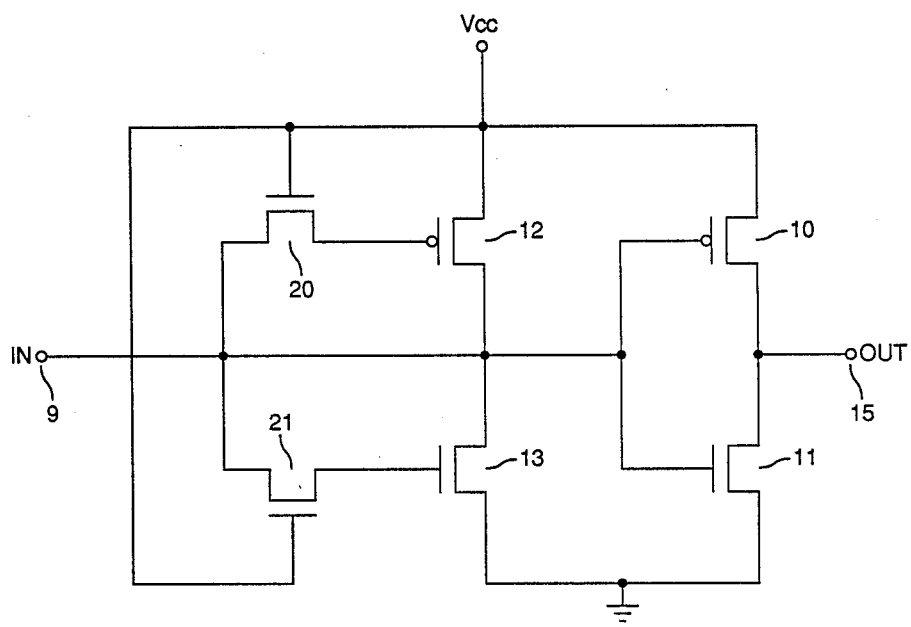
FIG. 2 is a circuit schematic of the clamped sense amplifier of another embodiment of the invention.

The sense amplifier of the embodiment of the invention shown in FIG. 2 is very similar to the one shown in FIG. 1 and the common elements have been numbered with the same reference numerals. The main difference between this embodiment and that of FIG. 1 is that the gates of MOS transistors 12 and 13 are not connected together, and two resistance means 20 and 21 are used rather than one. Resistance means 20 is coupled between the gate of transistor 12 and input terminal 9. Similarly, resistance means 21 is coupled between the gate of transistor 13 and input terminal 9. The gates of both of these N-channel transistors are coupled to $V_{cc}$, as shown. If P-channel transistors had been used, their gates would have been coupled to ground.

Resistance means 20 and 21 are selected to achieve the same results, described above, in the same manner as resistance means 14 in the embodiment in FIG. 1 was selected. The embodiment in FIG. 2 has an advantage over that in FIG. 1 because it is possible to optimize throughput time by selecting a different value for resistance means 20 from that selected for resistance means 21 in order to achieve that optimization.

The sense amplifier of this invention has it's most significant applications where the data path is synchronous. This means that the data is synchronized to events taking place at regular intervals, usually controlled by a clock. The assurance of regular transition intervals allows the designer to pick the proper size of the resistor 14 and thus the proper r-c time constant to insure that the recovery of the overshoot and undershoot voltage will take place before the next transition. It is very difficult to accomplish this if transition causing events take place at irregular intervals, but it still ca be done if at least minimum spacings between transitions always occur.

As will be apparent to one skilled in the art, the invention has been described in connection with its preferred embodiments, and may be changed and other embodiments derived without departing from the spirit and scope of the invention as set forth in the claims which follow.

I claim:
1. An improved CMOS clamped sense amplifier comprising:
    an input terminal for receiving a signal to be sensed;
    a voltage gain stage coupled to said input terminal having an output terminal for providing the amplified output signal from the sense amplifier;
    a CMOS input clamp circuit for receiving the signal to be sensed from said input terminal, including a pair of complementary MOS transistors having their drains coupled together and to said input terminal and opposite power supply terminals coupled to their sources; and
    resistance means coupled between the gates of the transistors of said clamp circuit and said input terminal, whereby the overall signal throughput speed of said sense amplifier is enhanced.
2. The improved CMOS clamped sense amplifier of claim 1 further characterized by the resistance value of said resistance means being selected to decrease the signal throughput time through said amplifier while allowing the signal input voltage to return to its steady-state level between input signal transitions.
3. The improved CMOS clamped sense amplifier of claim 1 further characterized by said resistance value being more than 1,000 ohms.
4. The improved CMOS clamped sense amplifier of claim 1 further characterized by said gates of the transistors of said CMOS input clamp circuit being connected together.
5. An improved CMOS clamped sense amplifier comprising:
    an input terminal for receiving the signal to be sensed;
    a voltage gain stage coupled to said input terminal having an output terminal for providing the amplified output signal from the sense amplifier;
    a CMOS input clamp circuit for receiving the signal to be sensed from said input terminal, including a pair of complementary MOS transistors having their drains coupled together and to said input terminal and their sources coupled respectively to opposite power supply terminals; and
    a pair of resistance means coupled respectively between each of the gates of the transistors of said clamp circuit and said input terminal, whereby the overall signal throughput speed of said sense amplifier is enhanced.

6. The improved CMOS clamped sense amplifier of claim 5 further characterized by the resistance value of said pair of resistance means being selected to decrease the signal throughput time through said amplifier while allowing the signal input voltage to return to its steady-state level between input signal transitions.

7. The improved CMOS clamped sense amplifier of claim 6 further characterized by said resistance value being more than 1,000 ohms.

* * * * *